(12) United States Patent
Howells

(10) Patent No.: US 6,775,452 B2
(45) Date of Patent: Aug. 10, 2004

(54) PHOSPHOR COATED WAVEGUIDE FOR EFFICIENT COLLECTION OF ELECTRON-GENERATED PHOTONS

(75) Inventor: Samuel C. Howells, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 455 days.

(21) Appl. No.: 09/861,036

(22) Filed: May 18, 2001

(65) Prior Publication Data

US 2002/0171030 A1 Nov. 21, 2002

(51) Int. Cl.[7] .................................................. G02B 6/02
(52) U.S. Cl. ...................... 385/128; 385/18; 250/484.2
(58) Field of Search ........................... 385/128, 14, 15, 385/16, 18, 31, 39; 250/484.2, 310, 397, 399

(56) References Cited

U.S. PATENT DOCUMENTS

| | | |
|---|---|---|
| 4,217,495 A | 8/1980 | Robinson |
| 4,700,075 A | 10/1987 | Kurz et al. |
| 5,043,583 A | 8/1991 | Robinson |
| 5,198,675 A | 3/1993 | Hikita et al. |
| 5,990,483 A | 11/1999 | Shariv et al. |
| 6,211,525 B1 * | 4/2001 | Cowham ................. 250/484.2 |
| 6,580,852 B2 * | 6/2003 | Iyoki .......................... 385/31 |

FOREIGN PATENT DOCUMENTS

WO WO9840906 * 9/1998 .......... H01J/37/244

* cited by examiner

*Primary Examiner*—Frank G. Font
*Assistant Examiner*—Kevin C Kianni
(74) *Attorney, Agent, or Firm*—Jung-hua Kuo

(57) ABSTRACT

A phosphor coated waveguide for efficient collection and detection of back-scattered electrons in an electron beam apparatus such as a scanning electron microscope is disclosed. The waveguide for directing photons to an optical detector generally comprises a first waveguide portion having opposing first and second faces defining a beveled hole therebetween to allow an electron beam to pass therethrough, the beveled hole decreasing in cross-sectional size from the first to the second face. A phosphor coating on the second face around the beveled hole converts the back-scattered electrons to photons. The first waveguide portion may include angled faces at an end further from the optical detector. A surface defined by the beveled hole and/or the angled faces may have a reflective coating. The waveguide may also include a second waveguide portion that adjoins and flares out relative to the first waveguide portion to further increase waveguide efficiency.

33 Claims, 4 Drawing Sheets

PHOSPHOR COATED WAVEGUIDE FOR EFFICIENT COLLECTION OF ELECTRON-GENERATED PHOTONS

BACKGROUND OF THE INVENTION

1. Field of the Invention

The present invention relates generally to an optical waveguide. In particular, a phosphor coated waveguide for efficient collection and detection of back-scattered electrons in an electron beam apparatus such as a scanning electron microscope is disclosed.

2. Description of Related Art

An electron beam apparatus that incorporates an electron beam microcolumn may be used in electron beam lithography as well as in electron microscopes such as a scanning electron microscope. Electron microscopes are often utilized to image and measure features on semiconductor wafers and can facilitate detection of contaminants. In an electron beam apparatus, a specimen to be examined, such as a semiconductor wafer, is scanned by an electron beam focused onto the specimen. Back-scattered and secondary electrons result from the electron beam impacting the specimen.

Backscattered and secondary electrons may be detected using scintillators. In a scintillator, electrons strike a phosphor coating on a surface of a waveguide and are converted to photons. The phosphor coating is usually deposited on a surface of the waveguide about an axis of the electron beam. The photons generated as a result of the electrons striking the phosphor are collected and directed through the waveguide to an end where an optical detector is placed. The waveguide is generally disposed such that the photons are directed along a length of the waveguide perpendicular to the electron beam axis toward the optical detector. The optical detector such as a photomultiplier tube (PMT) detects the photons that reach the end of the waveguide.

FIG. 1 is a schematic of a conventional electron beam microscope system 20 and FIG. 2 is a top view of a conventional waveguide 30 utilized by the electron beam microscope system of FIG. 1. As shown in FIG. 1, the electron beam system 20 includes an electron beam source 22 that generates and focuses an electron beam 24 through the waveguide 30 onto a specimen 26 to be examined. Back-scattered and secondary electrons 28 result from the electron beam 24 impacting the specimen 26 and are generally directed toward the waveguide 30 and/or a phosphor coated region 44 of the waveguide 30. The waveguide is typically made of glass or plastic.

As shown in FIGS. 1 and 2, the waveguide 30 includes two side faces 32 as well as angled faces 34 extending between a top and a bottom face 36, 38, respectively. An optical detector (not shown) is located at an end 40 of the waveguide 30. The waveguide defines a hole 42 about an axis of the electron beam through which the electron beam passes. In addition, the phosphor coated region 44 of the waveguide is typically an annular phosphor coating on portions of the angled faces 34 about the hole 42.

As noted above, back-scattered and secondary electrons strike the phosphor coating 44 and are converted to photons that are ideally directed by the waveguide 30 toward the waveguide end 40 for detection by the optical detector. The angled faces 34 tend to reflect photons toward the end 40 either directly or off the side, top and/or bottom faces 32, 36, 38, respectively.

However, conventional electron beam microscope systems such as the one shown and described with reference to FIGS. 1 and 2 typically have low collection efficiency, thereby limiting the speed at which the conventional systems can be operated. As is well known in optics, an angle of incidence $\theta_i$, i.e., measured relative to the normal of an interface or surface that the photons strike, greater than or equal to the critical angle achieves total internal reflection, i.e., no refraction. In contrast, at least a portion of the photons that strike a surface at an angle less than the critical angle is transmitted through the waveguide material, i.e., refracted. Refraction of the photons decreases the collection efficiency in that the refracted photons do not reach and thus are not detected by the detector.

The critical angle depends upon the relative refractive indexes of the two different materials through which light travels. Because electron beam microscope systems operate in vacuum ($n_{vacuum}=1$), the critical angle is given by Arc sin (1/n) where n is the refractive index of the waveguide material.

In addition, the photon collection efficiency may not be homogeneous in that the collection efficiency may be dependent upon where the electron strikes the phosphor. In the electron beam microscope system shown in FIGS. 1 and 2, electrons that strike the phosphor on the right side of the hole are more efficiently collected than those that strike the left side of the hole. The collection inhomogeneity leads to a reduced contrast depending upon how the electrons scatter from the specimen.

As advances in semiconductor fabrication technologies have enabled fabrication of smaller and smaller integrated circuits, it has become increasingly important to accurately, efficiently, and effectively detect contamination on the semiconductor wafers in a time-efficient manner. Thus, it is desirable to provide a waveguide that has an improved collection efficiency by providing a waveguide that results in greater portion of photons being detected by the optical detector. It is also desirable to provide a waveguide that has an improved collection efficiency homogeneity. It is further desirable to limit the size of the waveguide, e.g., to approximately 1.5 mm in thickness and/or approximately 6 mm in width, depending upon its application.

SUMMARY OF THE INVENTION

A phosphor coated waveguide for efficient collection and detection of back-scattered electrons in an electron beam apparatus such as a scanning electron microscope is disclosed. It should be appreciated that the present invention can be implemented in numerous ways, including as a process, an apparatus, a system, a device, or a method. Several inventive embodiments of the present invention are described below.

According to one preferred embodiment, a waveguide for use in an electron microscope generally comprises a first waveguide portion having opposing first and second faces defining a beveled hole therebetween to allow an electron beam to pass therethrough, the beveled hole decreasing in cross-sectional size from the first to the second face. The second face has a phosphor coating around the beveled hole. The beveled hole includes a beveled portion and optionally a straight portion. The beveled portion defines a beveled surface preferably coated with a reflective material. Generally, the beveled surface may be at an angle between approximately 35° and 55°, and more preferably at 45°, relative to the first face. The waveguide optionally includes a second waveguide portion having opposing first and second ends, the first end being coupled to the first waveguide portion and the second end being larger than the first end and adapted to be coupled to an optical detector.

In another embodiment, a waveguide for use in an electron microscope generally comprises a first waveguide portion having opposing first and second faces defining a hole therebetween to allow an electron beam to pass therethrough, a phosphor coating on the second face disposed about the hole, and a second waveguide portion having opposing first and second ends, the first end being adapted to be coupled to the first waveguide portion and the second end being larger than the first end and adapted to be coupled to an optical detector.

The second waveguide portion has first and second sides that preferably taper at a taper angle relative to the first and second faces of the first waveguide portion, respectively. The taper angle is generally between approximately 7° and 15°, and more preferably approximately 10°. Alternatively the second side is non-tapered while the taper for the first side is increased to approximately 15° to 20°.

With regard to any of the waveguide embodiments, the first waveguide portion may further comprise opposing first and second ends, the second end being disposed toward an optical detector and the first end having a plurality of adjoining angled faces extending between the first and second faces of the first waveguide portion. The angled faces may include two or three angled faces forming an angle of approximately 90° or 135°, respectively, therebetween. The angled faces may have a reflective coating thereon.

In yet another alternative embodiment, the waveguide may also include a cylindrical light guide adapted to be coupled to the first or second waveguide portion and an optical detector. The cylindrical light guide generally comprises a face adapted to be coupled to the first or second waveguide portion for receiving light therefrom, an angled face having a reflective coating thereon and disposed at approximately 45° relative to an axis of the cylindrical light guide for reflecting light received by the face, and a cylindrical section through which light reflected from the angled face is guided to the optical detector.

These and other features and advantages of the present invention will be presented in more detail in the following detailed description and the accompanying figures which illustrate by way of example the principles of the present invention.

BRIEF DESCRIPTION OF THE DRAWINGS

The present invention will be readily understood by the following detailed description in conjunction with the accompanying drawings, wherein like reference numerals designate like structural elements, and in which.

DESCRIPTION OF SPECIFIC EMBODIMENTS

A phosphor coated waveguide for efficient collection and detection of back-scattered electrons in an electron beam apparatus such as a scanning electron microscope is disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

Figure 1:
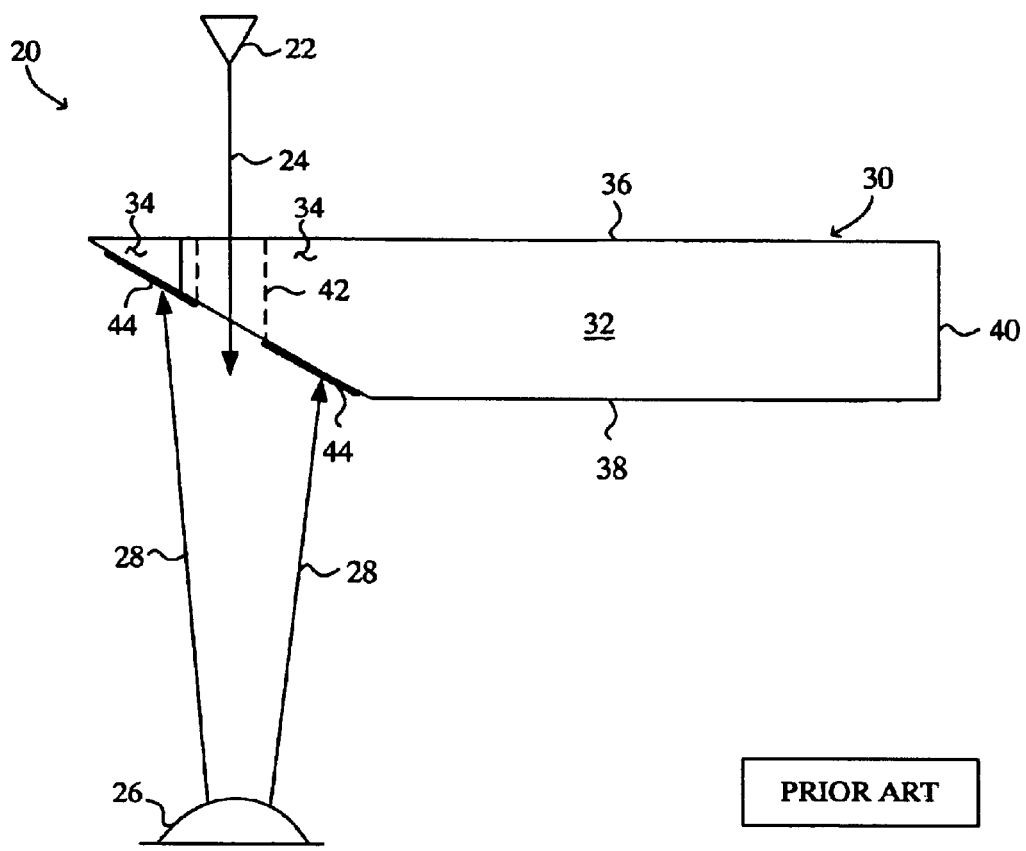
FIG. 1 is a schematic of a conventional electron beam microscope system.
Figure 2:
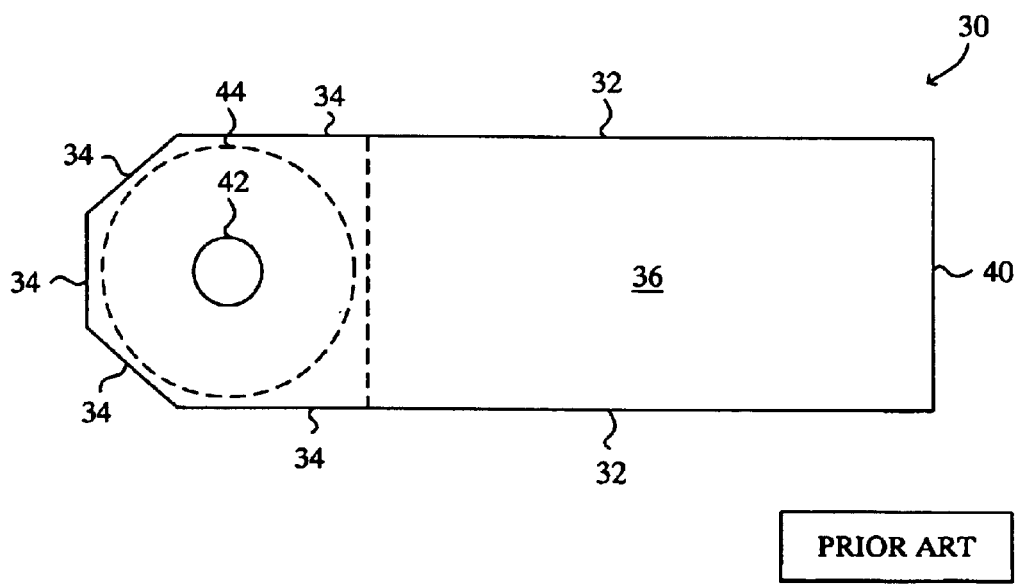
FIG. 2 is a top view of a conventional waveguide utilized by the electron beam microscope system of FIG. 1.
Figure 3:
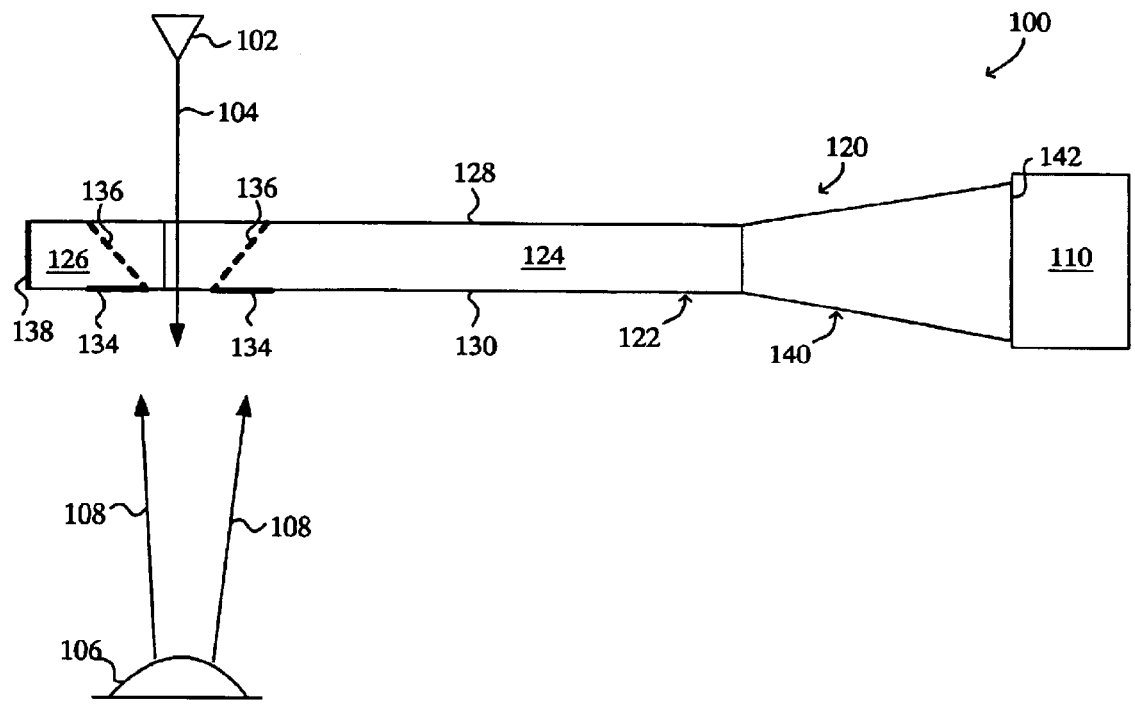
FIG. 3 is a schematic of an electron beam microscope system incorporation a waveguide according to one preferred embodiment of the present invention.
Figure 4:
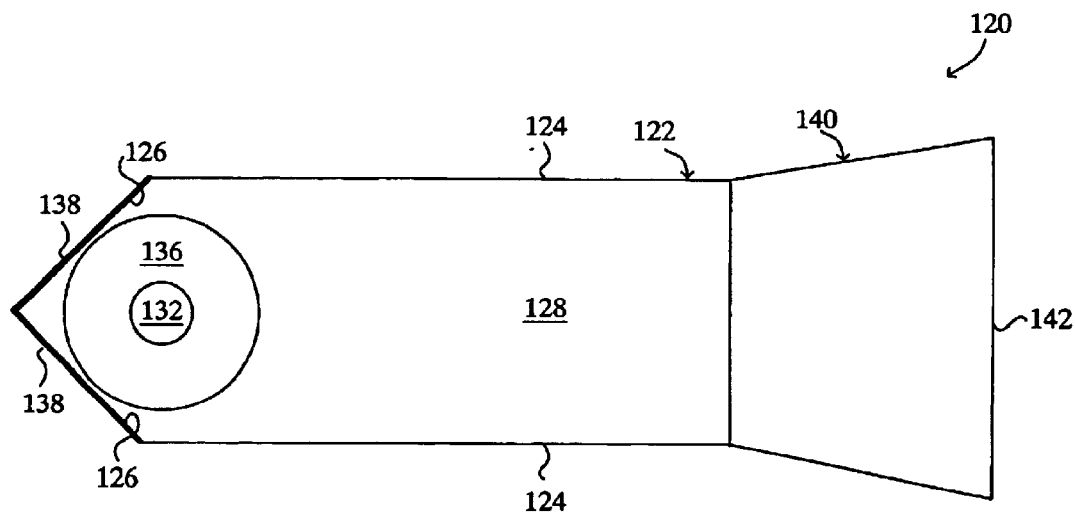
FIG. 4 is a top view of the waveguide utilized by the electron beam microscope system of FIG. 3.

FIG. 3 is schematic of an electron beam microscope system 100 utilizing a waveguide 120 according to one preferred embodiment of the present invention. FIG. 4 is a top view of the waveguide 120 utilized by the electron beam microscope 100 system of FIG. 3. As shown, the electron beam system 100 generally includes an electron beam source 102 that generates and focuses an electron beam 104 through the waveguide 120 onto a specimen 106 to be inspected and examined. The electron beam 104 impacts the specimen 106 to generate back-scattered and secondary electrons 108 that are generally directed toward the waveguide 120. It is to be understood that although both back-scattered and secondary electrons may be generated and/or detected, the description herein may refer only to back-scattered electrons for purpose of clarity.

The waveguide 120 includes a main portion 122 that may be directly coupled to an optical detector 110 such as a photomultiplier tube (PMT). The optical detector 110 detects the photons that reach the end of the waveguide to which the detector is coupled. More preferably, the waveguide 120 also includes a flared or tapered end portion 140 having an end face 142 to which the optical detector 110 can be coupled as shown in FIG. 3. The tapered end portion 140 has faces that are contiguous with faces of the waveguide main potion 122. The waveguide main and flared portions 122, 140 may comprise a single integrated component or separate components joined with an interface having minimal loss. Each of the main portion 122 and the flared end portion 140 of the waveguide 120 are described in more detail below.

The waveguide main portion 122 generally has two opposing side faces 124 and adjoining angled faces 126 between a top and a bottom face 128, 130, respectively. The waveguide 120 defines a beveled hole 132 extending between the top and bottom faces 128, 130 about an axis of the electron beam 104 through which the electron beam passes. The hole is beveled is such a way that a circular cross section of the hole 132 decreases in size from the top face 128 toward the bottom face 130. It is noted that the hole 132 need not be beveled through an entire depth of the waveguide 120 from the top face 128 to the bottom face 130. For example, the hole 132 may be beveled from the top face 128 through a portion of the depth and then extend straight (i.e., parallel to the electron beam 104 or normal to the top and bottom faces 128, 130), to the bottom face 130. As another example, the hole 132 may extend straight and parallel to the electron beam 104 from the top face 128 for a portion of the waveguide depth and bevel the remainder of the waveguide depth to the bottom face 130.

In addition, the waveguide 120 has a phosphor coating 134 on portions of the bottom face 130. Preferably, the phosphor coating 134 is annular about the beveled hole 132. The back-scattered electrons 108 striking the phosphor coating 134 are converted to photons. The phosphor coating may act as a lambertian source that directs most of the emitted light toward the interior of the waveguide 120. The photons are ideally directed by the waveguide 120 toward the end face 142 so as to be detected by the optical detector 110.

According to one preferred embodiment, a surface defined by the beveled hole 132 is coated with a reflective coating 136. In the case where the beveled hole is beveled only for a portion of its depth, preferably only a surface defining the beveled portion has a reflective coating thereon. In addition, the angled faces 126 are preferably also coated with a reflective coating 138. Any suitable material may be utilized for the reflective coatings and is preferably selected according to the wavelength of the photons produced by the phosphor coating 134. For an optical wavelength of approximately 400 nm, examples of preferred reflective coating materials include aluminum and silver. Any other suitable reflective coating materials may be utilized such as gold, rhodium, and chrome. Optionally, any or all surfaces of the waveguide 120 may be polished to specularly reflect light impinging on the surfaces. Polishing may rid the surfaces of scattering centers that may allow light to escape the structure. In addition, polishing may prevent external light from entering the waveguide. The waveguide may be shielded to protect again external light from entering the waveguide.

The waveguide 120 preferably increases or maximizes the number of photons generated by the phosphor that arrive at the end face 142 in order to increase or maximize the efficiency of the waveguide 120, such as by directing the photons such that reflections off the side, angled, top, and/or bottom faces 124–130 are at angles greater than the critical angle. The critical angle for an interface through which light travels depends upon the relative refractive indexes of the two different materials at the interface. Because the electron beam microscope system operates in vacuum ($n_{vacuum}=1$), the critical angle is given by Arc sin (1/n) where n is the refractive index of the waveguide material. The waveguide is typically made of glass or plastic. For a refractive index n of 1.5 in the case where the waveguide material is glass, the critical angle $\theta_c$ is approximately 41.8°.

To achieve greater waveguide efficiency, an interior face of the reflective-coated beveled hole 132 is aligned at an angle such that photons that strike the bevel face are generally reflected radially outward from the interior bevel face in a direction nearly parallel to the top and bottom faces 128, 130. In particular, the photons that strike a portion of the interior beveled face of the hole 132 that is closer to the end face 142 than the electron beam 104 (i.e., the portion to the right of the electron beam 104 in FIGS. 3 and 4) are generally reflected along the length of the waveguide 120 to arrive at the end face 142 either directly or after one or more reflections off the side, top, and/or bottom faces 124, 128, 130 at angles greater than the critical angle for maximize efficiency.

In addition, the photons that strike a portion of the reflective-coated bevel face of the hole 132 that is further from the end face 142 than the electron beam 104 (i.e., the portion to the left of the electron beam 104 in FIGS. 3 and 4) may strike and be reflected off of the angled reflective-coated faces 126. The angled faces 126 are preferably aligned at an angle so as to maximize the efficiency at which photons that strike the angled faces 126 are directed toward the end face 142. Preferably, the angled faces 126 comprise of two or three angled faces although any other suitable number of angled faces may be utilized and may be disposed at any suitable angles relative to each other. For example, in the case of two angled faces 126 as shown, the two angled faces may be disposed at approximately 90° relative to each other. In the case of three angled faces (not shown), the three angled faces may be disposed at approximately 135° relative to each other.

The photons reflected off of the angled faces 126 are preferably directed from the angled faces 126 in a direction so as to avoid striking the face defined by the beveled hole 132 and so as to be directed toward the end face 142 either directly or after one or more reflections off the side, top, and/or bottom faces 124, 128, 130 preferably at angles greater than the critical angle. It is noted that some photons may strike the face defined by the bevel hole after being reflected off of the angled faces 126. Those photons may eventually be reflected and directed toward the end face 142 or may be transmitted through the waveguide material and thus not be detected by the optical detector 110.

The flared end portion 140 of the waveguide 120 may further facilitate in increasing the waveguide efficiency. In particular, it is desirable to direct the photons such that they arrive at the end face 142 at an angle of incidence relative to an interface between the end face 142 and the optical detector 110 that is less than the critical angle such that the photons are not reflected away from the optical detector 140. Without the flared end portion 140 of the waveguide 120, more of the photons striking the end face 142 may strike the end face 142 at an angle of incidence greater than the critical angle and thus would be reflected away from the optical detector 140. The flared end portion 140 thus facilitates in increasing the portion of photons striking the end face 142 that are transmitted through the end face 142 and detected by the optical detector 110. Preferably, all sides of the flared end portion 140 are tapered relative to the corresponding sides of the main portion 122 of the waveguide 120 as is shown in FIGS. 3 and 4. In addition, each tapered side is preferably tapered at the same angle. However, it is noted that any combination of tapered and non-tapered sides as well as taper angles for the tapered sides may be selected and utilized depending upon constraints of specific applications and/or fabrication of the waveguide.

The dimensions of the waveguide 120 are preferably such that the waveguide 120 can be utilized in an electron microscope with a microcolumn as the electron source 102 having a cross-sectional area of approximately one inch square. In one exemplary embodiment, the waveguide is approximately 22 mm in length of which approximately 16 mm is the main portion 122 and 6 mm is the flared end portion 140. The main portion 122 is approximately 6 mm in width between the side faces 124 and 1.5 mm in depth between the top and bottom face 128, 130. The beveled hole 132 extends from a diameter of approximately 4.4 mm at the top surface 128 to a diameter of approximately 1.4 mm at the bottom surface 130. The beveled hole 132 has a bevel angle of approximately 49°. Generally, the bevel angle is preferably between 35° and 55° relative to the top or bottom surface. The annular phosphor coating 136 preferably extends from the hole 132 and has an outer diameter of approximately the same as the upper or larger diameter of the beveled hole, e.g., 4.4 mm. In addition, the two angled faces 126 forms an angle of between approximately 70° and 110° or approximately 90° as shown.

The flared end portion 140 is approximately the same in width and depth where it mates with the main portion 122. Each of the four faces of the flared end portion may have a taper of approximately 10°. This configuration of the flared end portion 140 increases the collection efficiency of the waveguide 120 by approximately 30%. Generally, the taper is preferably between 7° and 15° for a flared end portion with a length of approximately 6 mm. For a longer flared end portion, the taper is preferably decreased while for a shorter flared end portion, the taper is preferably increased. Thus, the end face 142 is approximately 8.1 mm in width and 3.6 mm in depth.

It is to be understood that any combination of suitable waveguide dimensions, bevel angles, angled face angles, flared end tapers, and/or materials such as the material of the reflective coatings, the waveguide material, and the scintillator material may be selected depending upon specific applications. For example, factors may include a tradeoff between efficiency homogeneity and overall efficiency, constraints regarding the size of the waveguide, type of material for the waveguide, type of material utilized for the reflective coating, and/or type of phosphor.

Figure 5:
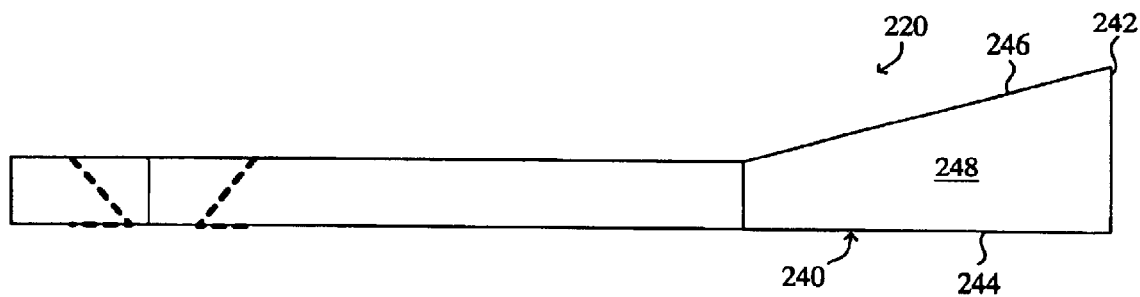
FIG. 5 is a schematic of an alternative embodiment of a waveguide of the present invention.
Figure 6:
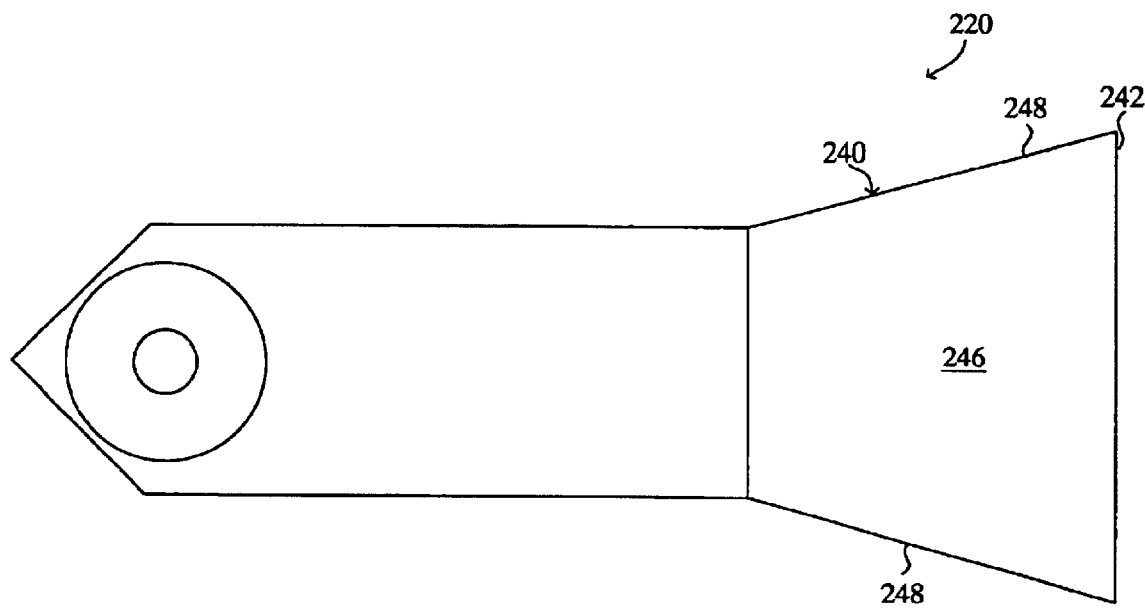
FIG. 6 is a top view of the alternative waveguide of FIG. 5.

FIG. 5 is a schematic of an alternative embodiment of a waveguide 220 of the present invention. FIG. 6 is a top view of the alternative waveguide 220 of FIG. 5. As shown, the waveguide 220 is similar to that shown in FIGS. 3 and 4 except that a flared or tapered end portion 240 is modified. Specifically, the flared end portion 240 is not flared at a bottom face 244 such that the waveguide may be placed closer to a specimen to be examined (not shown). To at least partially compensate for the unflared bottom face 244, a taper of a top face 246 is preferably increased, for example, to approximately 20° while two side faces 248 have tapers of approximately 10°. Generally, where taper of one face is modified, only taper of its opposing face is preferably adjusted to compensate for the modification. In another alternative embodiment, the flared end portion may be alternatively or additionally lengthened, for example, from approximately 6 mm to approximately 8 mm.

Figure 7:
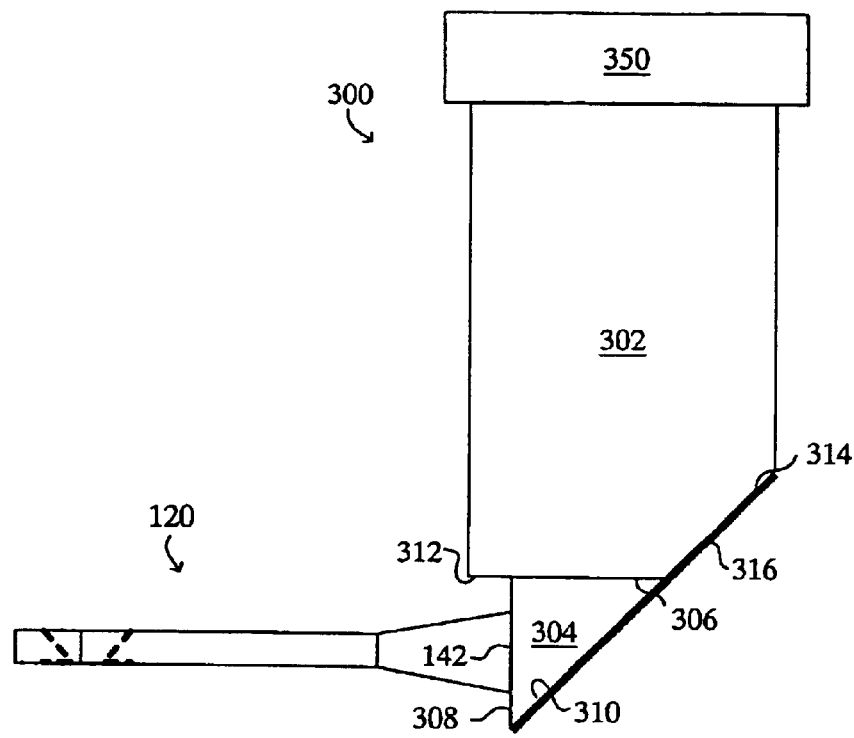
FIG. 7 is a schematic of the waveguide of FIG. 3 coupled to an exemplary cylindrical light guide.

FIG. 7 is a schematic side view of the waveguide 120 of FIGS. 3 and 4 coupled to an exemplary cylindrical light guide 300. The cylindrical light guide 300 facilitates in placing an optical detector 350 in a more mechanically advantageous location. The cylindrical light guide 300 may comprise an optical cylinder 302 bonded to a 90° prism 304 in any suitable manner such as via a sleeve (not shown). Preferably, both the optical cylinder 302 and the prism 304 are made of the same material as the waveguide 120 or of a material with a refractive index close to or same as that of the waveguide.

The prism 304 defines a top face 306, an end face 308, and a 45° angled face 310. The waveguide end face 142 is preferably centrally aligned relative to the prism end face 308. In one exemplary embodiment, the prism 304 is approximately 7 mm in height and length and approximately 10 mm in width. As previously noted, the end face 142 of the exemplary waveguide 120 is approximately 8.1 mm in width and 3.6 mm in depth. Thus, the width of the prism end face 308 is slightly larger than the width of the waveguide end face 142.

The optical cylinder 302 is approximately 14 mm in diameter and defines a bottom face 312 and a 45° angled face 314. Generally, the optical cylinder 302 and the prism 304 are preferably relatively sized such that no or a minimal amount of the prism top face 306 extends beyond the optical cylinder bottom face 312 to which the prism 304 is bonded.

In particular, the optical cylinder 302 may be aligned relative to the prism 304 such that an approximately 2 mm portion of the cylinder bottom face 312 extends beyond the prism 304 toward the waveguide 120. In addition, the optical cylinder angled face 314 extends beyond the prism 304 away from the waveguide 120 and spans approximately 5 mm of the diameter of the optical cylinder 302. The 45° optical cylinder angled face 314 is approximately contiguous with and parallel to the 45° prism angled face 310. The cylindrical light guide 300 further includes a reflective coating 316 covering both angled faces 310, 314.

Light from the waveguide is received from the waveguide 120 at the prism end face 308 and reflected by one or both of the angled faces 310, 314. The light is then guided by the optical cylinder 302 toward the optical detector 350.

Figure 8:
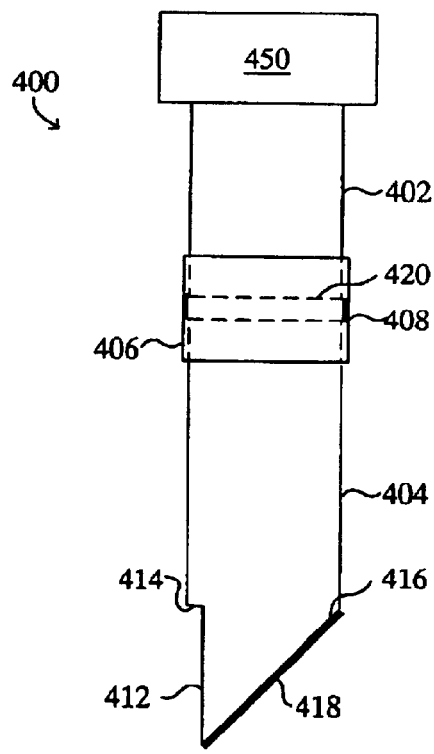
FIG. 8 is a schematic of an alternative cylindrical light guide.

FIG. 8 is a schematic side view of an alternative cylindrical light guide 400. The cylindrical light guide 400 facilitates in placing an optical detector 450 in a more mechanically advantageous location. The cylindrical light guide 400 may comprise two optical cylinders 402, 404 preferably of a refractive index close to or same as that of the waveguide and of approximately the same diameters relative to each other. The optical cylinders 402, 404 are coaxially aligned and are coupled via a tight fitting sleeve 406. The sleeve 406 preferably has a reflective coating 408 on a portion of its interior surface that surrounds a gap 420 defined by the optical cylinders 402, 404. Sleeve 402 is coupled to the optical detector 450 while sleeve 404 is coupled to the end face of the waveguide.

Sleeve 404 preferably defines a flat face 412 and a notch 414 to facilitate mating the cylindrical light guide 400 with the end face of the waveguide. Sleeve 404 also defines an angled face 416 having a reflective coating 418 to guide light from the sleeve 412 toward the optical detector 450. Light from the waveguide is received at the face 412 and reflected by the angled face 416. The light is then guided by the optical cylinders 402, 404 toward the optical detector 450.

Although exemplary coupling configurations between a waveguide and an optical detector coupling have been shown and described herein, any suitable coupling configurations may be implemented depending upon specific applications.

While the preferred embodiments of the present invention are described and illustrated herein, it will be appreciated that they are merely illustrative and that modifications can be made to these embodiments without departing from the spirit and scope of the invention. Thus, the invention is intended to be defined only in terms of the following claims.

What is claimed is:

1. A waveguide for use in an electron microscope, comprising:
  a first waveguide portion having a first face and a second face opposing said first face, the first and second faces defining a beveled hole therebetween to allow an electron beam to pass therethrough, said beveled hole having a first portion toward the first face and a second portion toward the second face, the second portion being smaller than the first portion; and
  a phosphor coating on the second face around said beveled hole.

2. The waveguide of claim 1, wherein said beveled hole defines a beveled surface, further comprising a reflective coating on said beveled surface.

3. The waveguide of claim 1, wherein said beveled hole includes a beveled portion and a straight portion generally normal to said first and second faces.

4. The waveguide of claim 3, wherein said beveled portion of said beveled hole defines a beveled surface, further comprising a reflective coating on said beveled surface.

5. The waveguide of claim 1, wherein said beveled hole defines a beveled surface, said beveled surface being approximately 45° relative to said first face.

6. The waveguide of claim 1, wherein said beveled hole defines a beveled surface, said beveled surface being at an angle between approximately 35° and 55° relative to said first face.

7. The waveguide of claim 1, further comprising a second waveguide portion having a first end and a second end opposing said first end, said second end being larger than said first end, said first end being adapted to be coupled to said first waveguide portion and said second end being adapted to be coupled to an optical detector.

8. The waveguide of claim 7, wherein said second waveguide portion has a first side contiguous with said first face of said first waveguide portion and a second side opposing said first side and contiguous with said second face of said first waveguide portion, wherein said first and second sides are tapered at a taper angle relative to said first and second faces of said first waveguide portion, respectively.

9. The waveguide of claim 8, wherein said taper angle is approximately 10°.

10. The waveguide of claim 8, wherein said taper angle is between approximately 7° and 15°.

11. The waveguide of claim 7, wherein said second waveguide portion has a first side and a second side opposing said first side, said first side is contiguous with and tapered approximately 20° relative to said first face of said first waveguide portion and said second side is contiguous with and approximately parallel to said second face of said first waveguide portion.

12. The waveguide of claim 1, further comprising a first end and a second end opposing said first end, said second end being adapted for coupling to an optical detector, said first end comprising a plurality of adjoining angled faces extending between said first and second faces.

13. The waveguide of claim 12, wherein said plurality of adjoining angled faces includes two angled faces, said two angled faces forming an angle of approximately 90°.

14. The waveguide of claim 12, wherein said plurality of adjoining angled faces includes three angled faces, each of said adjoining three angled faces forming an angle of approximately 135° relative another of said adjoining three angled faces.

15. The waveguide of claim 12, further comprising a reflective coating on said plurality of adjoining angled faces.

16. The waveguide of claim 1, wherein said first and second faces are approximately 16 mm in length and 6 mm in width and are disposed approximately 1.5 mm apart, said beveled hole having a diameter of approximately 4.4 mm at said first face and a diameter of approximately 1.4 mm at said second face.

17. The waveguide of claim 1, further comprising a cylindrical light guide adapted to be coupled to said first waveguide portion and an optical detector, said cylindrical light guide comprising:
 a face adapted to be coupled to the first waveguide portion for receiving light therefrom;
 an angled face having a reflective coating thereon and disposed at approximately 45° relative to an axis of said cylindrical light guide for reflecting light received by said face; and
 a cylindrical section through which light reflected from the angled face is guided to the optical detector.

18. A waveguide for use in an electron microscope, comprising:
 a first waveguide portion having a first face and a second face opposing said first face, the first and second faces defining a hole therebetween to allow an electron beam to pass therethrough;
 a phosphor coating on the second face disposed about said hole; and
 a second waveguide portion having a first end and a second end opposing said first end, said second end being larger than said first end, said first end being adapted to be coupled to said first waveguide portion and said second end being adapted to be coupled to an optical detector.

19. The waveguide of claim 18, wherein said second waveguide portion has a first side contiguous with said first face of said first waveguide portion and a second side opposing said first side and contiguous with said second face of said first waveguide portion, and wherein said first and second sides are tapered at a taper angle relative to said first and second faces of said first waveguide portion, respectively.

20. The waveguide of claim 19, wherein said taper angle is approximately 10°.

21. The waveguide of claim 19, wherein said taper angle is between approximately 7° and 15°.

22. The waveguide of claim 18, wherein said second waveguide portion has a first side and a second side opposing said first side, said first side is contiguous with and tapered approximately 20° relative to said first face of said first waveguide portion and said second side is contiguous with and approximately parallel to said second face of said first waveguide portion.

23. The waveguide of claim 18, wherein said hole is a beveled hole having a first opening at said first face and a second opening at said second face, the second opening being smaller than the first opening.

24. The waveguide of claim 23, wherein said beveled hole defines a beveled surface, further comprising a reflective coating on said beveled surface.

25. The waveguide of claim 23, wherein said beveled hole includes a beveled portion and a straight portion generally normal to said first and second faces.

26. The waveguide of claim 25, wherein said beveled portion of said beveled hole defines a beveled surface, further comprising a reflective coating on said beveled surface.

27. The waveguide of claim 23, wherein said beveled hole defines a beveled surface, said beveled surface being approximately 45° relative to said first face.

28. The waveguide of claim 23, wherein said beveled hole defines a beveled surface, said beveled surface being at an angle between approximately 35° and 55° relative to said first face.

29. The waveguide of claim 18, wherein said first waveguide portion further comprises a first end portion and a second end portion opposing said first end portion, said second end portion being adapted for coupling to said first end of said second waveguide portion, said first end portion comprising a plurality of adjoining angled faces extending between said first and second faces.

30. The waveguide of claim 29, wherein said plurality of adjoining angled faces includes two angled faces, said two angled faces forming an angle of approximately 90°.

31. The waveguide of claim 29, further comprising a reflective coating on said plurality of adjoining angled faces.

32. The waveguide of claim 18, wherein said first and second faces of the first waveguide portion are approximately 16 mm in length and 6 mm in width and are disposed approximately 1.5 mm apart, said hole having a diameter of at least approximately 1.4 mm, said first end of said second waveguide portion is approximately 6 mm in width and mm 1.5 mm in depth, said second end of said second waveguide portion is approximately 8.1 mm in width and 3.6 mm in depth.

33. The waveguide of claim 18, further comprising a cylindrical light guide adapted to be coupled between said second waveguide portion and the optical detector, said cylindrical light guide comprising:

a face adapted to be coupled to the second waveguide portion for receiving light therefrom;

an angled face having a reflective coating thereon and disposed at approximately 45° relative to an axis of said cylindrical light guide for reflecting light received by said face; and a cylindrical section through which light reflected from the angled face is guided to the optical detector.

\* \* \* \* \*